(12) United States Patent
Allsop et al.

(10) Patent No.: US 8,609,516 B2
(45) Date of Patent: *Dec. 17, 2013

(54) ATMOSPHERIC PRESSURE CHEMICAL VAPOR DEPOSITION METHOD FOR PRODUCING AN-N-SEMICONDUCTIVE METAL SULFIDE THIN LAYER

(75) Inventors: Nicholas Allsop, Berlin (DE); Christian-Herbert Fischer, Berlin (DE); Sophie Gledhill, Berlin (DE); Martha Christina Lux-Steiner, Berlin (DE)

(73) Assignee: Helmholtz-Zentrum Berlin fuer Materialien und Energie GmbH, Berlin (DE)

( * ) Notice: Subject to any disclaimer, the term of this patent is extended or adjusted under 35 U.S.C. 154(b) by 453 days.

This patent is subject to a terminal disclaimer.

(21) Appl. No.: 12/935,356

(22) PCT Filed: Mar. 14, 2009

(86) PCT No.: PCT/DE2009/000361
§ 371 (c)(1),
(2), (4) Date: Dec. 23, 2010

(87) PCT Pub. No.: WO2009/121322
PCT Pub. Date: Oct. 8, 2009

(65) Prior Publication Data
US 2011/0104876 A1    May 5, 2011

(30) Foreign Application Priority Data
Apr. 1, 2008    (DE) .................. 10 2008 017 076

(51) Int. Cl.
*H01L 21/20*    (2006.01)
(52) U.S. Cl.
USPC ............ 438/478; 257/E21.279; 257/E27.125; 136/252

(58) Field of Classification Search
USPC .................. 136/252; 257/E21.279, E21.274, 257/E21.308, E27.125; 438/402, 478, 479
See application file for complete search history.

(56) References Cited

U.S. PATENT DOCUMENTS

| 8,143,145 B2 * | 3/2012 | Allsop et al. .................. 438/478 |
| 2008/0012015 A1 | 1/2008 | Shim et al. |
| 2011/0017283 A1 * | 1/2011 | Kampmann et al. .......... 136/252 |

FOREIGN PATENT DOCUMENTS

| DE | 19831214 C2 | 7/2003 |
| DE | 102008017076 B3 | 9/2009 |
| WO | 97/32056 A1 | 9/1997 |

OTHER PUBLICATIONS

Allsop et al. ("Spray-ILGAR Indium Sulfide Buffers for Cu(In, Ga) (S, Se)2 Solar Cells", Prog. Photovolt: Res. Appl. 2005, 13, 607-616) (Aug. 2, 2005).*

(Continued)

*Primary Examiner* — William F Kraig
(74) *Attorney, Agent, or Firm* — Leydig, Voit & Mayer, Ltd.

(57) ABSTRACT

An atmospheric pressure chemical vapor deposition method for producing an N-type semiconductive metal sulfide thin film on a heated substrate includes converting an indium-containing precursor to at least one of a liquid phase and a gaseous phase. The indium-containing precursor is mixed with an inert carrier gas stream and hydrogen sulfide in a mixing zone so as to form a mixed precursor. A substrate is heated to a temperature in a range of 100° C. to 275° C. and the mixed precursor is directed onto the substrate. The hydrogen sulfide is supplied at a rate so as to obtain an absolute concentration of hydrogen sulfide in the mixing zone of no more than 1% by volume. The In-concentration of the indium containing precursor is selected so as to produce a compact indium sulfide film.

16 Claims, 1 Drawing Sheet

(56) References Cited

OTHER PUBLICATIONS

Allsop et al. ("Solar Cells prepared with Spray-ILGAR Indium Sulfide Buffer layers of Cu(In, Ga)Se2 Absorbers", FMater. Res. Soc. Symp. Proc. vol. 865, 2005) (no month cited).*

Fischer et al. ("The spray-ILGAR (ion layer gas reaction) method for the deposition of thin semiconductor layers: Process and Applications for thin film solar cells", Solar Energy Materials and Solar Cells, 95, (2011) 1518-1526. (Dec. 31, 2010).*

Afzaal et al. "Metal organic-chemical vapor deposition of β-$In_2S_3$ thin films using a single-source approach" Journal of Materials Science: Materials in Electronics 14 (2003) pp. 555-557.

Allsop et al. "Indium sulfide thin films deposited by the spray ion layer gas reaction technique" Thin Solid Films 513 (2006) pp. 52-56.

Asikainen et al. "Growth of In2S3, thin films by atomic layer epitaxy" Applied Surface Science 82/83 (1994) pp. 122-125.

Barone et al. "Deposition of tin sulfide thin films from thin(IV) thiolate precursors" J. Mater. Chem., (2001) 11, pp. 464-468.

Diehl et al, "Vapour Growth of Three $In_1S_1$ Modifications by Iodine Transport" Journal of Crystal Growth 28 ( 1975) pp. 306-310 North-Holland Publishing Co.

Ernits et al. "Characterisation of ultrasonically sprayed $In_xS_y$ buffer Layers for Cu(In,Ga)Se$_2$ solar cells" Thin Solid Films 515 (2007) pp. 6051-6054.

Hehemann et al. "Synthesis, characterization and decomposition studies of tris(N,N-dibenzyldithiocarbamato)indium(III): chemical spray deposition of polycrystalline CuInS2 on copper films" Materials Science and Engineering B 116 (2005) pp. 381-389.

Molloy et al. "New Precursors for the Chemical Vapour Deposition of Tin Sulphide Semiconductors and Related Materials" Joint Review Report:GR/L56442/01 and GR/L54721/01 (2001).

Naghav et al. "High-Efficiency Copper Indium Gallium Diselenide (CIGS) Solar Cells with indium Sulfide Buffer Layers Deposited by Atomic Layer Chemical Vapor Deposition (ALCVD)" Prog. Photovolt: Res. Appl. (2003); 11 pp. 437-443.

Obrien et al.; "Novel precursors for the growth of α-$In_2S_3$: trisdialkyldithlocarbamates of indium" Thin Solid Films 315 (1988) pp. 57-61.

Parkin et al. "The first single source deposition of tin sulfide coatings on glass: aerosol-assisted chemical vapour deposition using [Sn(SCH$_2$CH$_2$S)$_2$]" J. Mater. Chem., (2001), 11, pp. 1486-1490.

Sawada et al. "Highly-conducting indium—tin-oxide transparent films frabricated by spray CVD using ethanol solution of indium (III) chloride and tin (II) chloride" Thin Solid Films 409 (2002) pp. 46-50.

Spiering et al.; "CD-Free Cu(In,Ga)Se$_2$ thin-film solar modules with $In_2S_3$ buffer layer by ALCVD" Thin Solid Films 431-432 (2003) pp. 359-363.

Takahashi et al. "Growth of InN at High Temperature by Halide Vapor Phase Epitaxy" Jpn. J. Appl. Phys. vol. 36 (1997) pp. L743-L745.

* cited by examiner

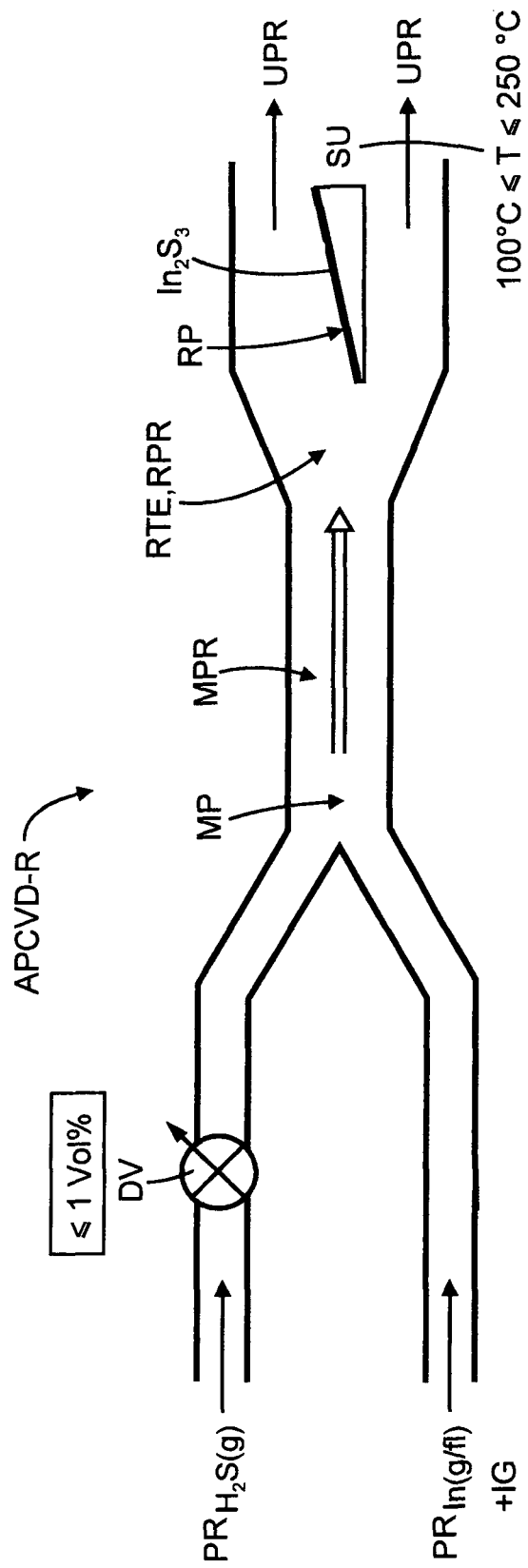

US 8,609,516 B2

ATMOSPHERIC PRESSURE CHEMICAL VAPOR DEPOSITION METHOD FOR PRODUCING AN-N-SEMICONDUCTIVE METAL SULFIDE THIN LAYER

CROSS REFERENCE TO RELATED APPLICATIONS

This application is a U.S. National Phase application under 35 U.S.C. §371 of International Application No. PCT/DE2009/000361, filed on Mar. 14, 2009, and claims benefit to German Patent Application No. DE 10 2008 017 076.3, filed on Apr. 1, 2008. The International Application was published in German on Oct. 8, 2009 as WO 2009/121322 A1 under PCT Article 21 (2).

FIELD

The present invention relates to an atmospheric pressure chemical vapor deposition method (APCVD) for producing an N-type semiconductive metal sulfide thin film on a heated substrate.

BACKGROUND

In chemical vapor deposition (CVD), a solid component is deposited from the gas phase on a heated substrate surface due to a chemical reaction. A special feature of this method is that it allows deposition of conformal films. In contrast to classical physical vapor deposition (PVD), chemical vapor deposition also allows coating of complex three-dimensionally shaped surfaces. This allows coating of, for example, the inner surface of hollow bodies or very fine grooves in wafers. A prerequisite for deposition from the gas phase is the existence of volatile precursor compounds of the film material, from which the solid film is deposited at a specific reaction temperature. In contrast to competing gas phase reactions, chemical vapor deposition processes are usually performed at reduced pressure (typically at 0.01-10 hPa) to promote the desired reactions on the surface and thus prevent the formation of solid particles in the gas phase, and to transfer more material into the gas phase when using less volatile precursors.

N-type semiconductive metal sulfide thin films are preferably used as buffer layers between the window layer and the absorber layer in solar cells, thereby allowing a significant increase in efficiency. A "buffer layer" is understood to be a layer having a higher band gap than the adjacent semiconducting absorber layer. This higher band gap can be achieved by alloying or by suitable material selection. Recombination in the interface area of the pn junction is reduced by improved interface conditions, leading to an increase in the open terminal voltage. The buffer layer is also intended to optimize the band alignment. CdS is an n-type semiconductor having a band gap of 2.4 eV and thus absorbs in the UV and blue regions of the solar spectrum. The thereby generated electron-hole pairs are not separated by the space charge region and, therefore, do not contribute to the current.

Increasingly, efforts are being made to substitute the toxic CdS layer by less toxic materials. In this connection, various variants of the CVD method are increasingly used, which also allows for good coverage of rough substrates. In particular, indium(III) sulfide ($In_2S_3$), which has an indirect band gap of 2 eV to 2.2 eV and, being an indirect semiconductor, therefore absorbs less light than the direct semiconductor CdS, is a promising candidate to replace the toxic CdS. Therefore, various methods for producing it have been described in the art. However, to date, it is not known to use a CVD method for producing it, since, according to the knowledge of those skilled in the art, the materials to be used tend to form solid reaction products already in the gas phase, resulting in inhomogeneous films with poor coverage on the substrate.

Methods of producing $In_2S_3$ films include direct evaporation, powder phase in a reducing atmosphere and annealing at 500° C. to 800° C., chemical bath deposition (CBD), physical vapor deposition (PVD), atomic layer vapor deposition (AL-CVD) or atomic layer epitaxy (ALE), chemical spray pyrolysis (CSP), ion layer gas reaction (ILGAR), and by aerosol assisted metal-organic chemical vapor deposition (AAMOCVD). However, it is not known to produce $In_2S_3$ films directly using CVD.

German Patent DE 198 31 214 C2 describes the manufacture of various metal sulfide layers suitable for use in solar cells, based on an ion-exchange reaction. The method described therein is the two-stage ILGAR method, in which, initially, a metal salt or a metal compound, as the starting material, is sequentially deposited, preferably by dipping or spraying, on a substrate heated to a temperature above 100° C., and is subsequently reacted with a reactive gas. A two-stage spray ILGAR process for manufacturing $In_2S_3$ films for use as buffer layers in solar cells is described in N. A. Allsop et al. "Indium Sulfide Thin Films Deposited by the Spray Ion Layer Gas Reaction Technique", Thin Solid Films 513 (2006) 52-56. In this process, initially, an $InCl_3$/ethanol solution is sprayed onto the heated substrate, resulting in the formation of a solid In(Cl,OH,O) precursor layer thereon, which is subsequently converted into an indium sulfide layer by exposure to $H_2S$ gas. The layer thickness can be controlled by repeating the two-stage cycle. In the experimental setup depicted in FIG. 1 of N. A. Allsop et al., supra, the shut-off valve required for the sequential spray ILGAR method with solid phase reaction on the substrate is shown in the $H_2S$ supply line. Contact of the sprayed $InCl_3$/ethanol solution with the $H_2S$ gas within the reaction space is strictly avoided because otherwise particles formation would occur in the reaction space, which is absolutely undesired. For this reason, purging with inert nitrogen gas is carried out between each of the individual steps of the method. Also, the information given in chapter 5 of N. A. Allsop et al., supra, according to which the precursor deposition (In(Cl,OH)) in the spray ILGAR method has similarities to the CVD method in the microscopic domain does not indicate to one skilled in the art the specific procedures to be used, since the same paragraph makes reference to the advantages of the spray ILGAR method in the macroscopic domain and for the deposition of $In_2S_3$.

In N. Takahashi et al. "Growth of InN at High Temperature by Halide Vapor Epitaxy", Jpn. J. Appl. Phys. Vol. 36 (1997) pp. L 743-L745, a special CVD method (vapor phase epitaxy) is described in which $InCl_3$ is involved as a precursor and which is used to produce InN (not used for solar cells) on a substrate heated to 750° C., using reactive $NH_3$ as a precursor gas. R. Diehl et al. "Vapor Growth of Three $In_2S_3$ Modifications by Iodine Transport", J. of Cryst. Growth 28 (1975) 306-310 describes growing $In_2S_3$ using halogen-containing transport gases. In Y. Sawada et al. "Highly-Conducting Indium-Tin-Oxide Transparent Films fabricated by Spray CVD Using Ethanol Solution of Indium (IM) Chloride and Tin (II) Chloride", Thin Solid Films 409 (2002) 46-50, a spray pyrolysis method having similarities to CVD is described which is used for producing $InSnO_x$ (as an ITO layer for solar cells) using an $InCl_3$/ethanol solution. However, the described method uses no reactive precursor gas and no $H_2S$, as is natural for oxides. The substrate is heated to temperatures of 300° C. to 350° C. K. Emits et al. "Characterisation of Ultrasonically Sprayed $In_xS_y$ Buffer layers for $Cu(In,Ga)Se_2$ Solar Cells" Thin Solid Films 515 (2007) 6051-6054 describes an ultrasonic spray pyrolysis method (chemical spray pyrolysis, CSP) in which an $InCl_3$/alcohol-thiourea solution is sprayed onto a heated substrate (about 380° C.) to produce $In_2S_3$. In this process, $H_2S$ gas is generated in situ from the thiourea. This method is used for making buffer layers. However, the high temperature required for pyrolysis and the occurrence of contamination, in particular oxide contamination, are disadvantages of the spray pyrolysis method. Spray pyrolysis does not work at low temperatures. The use of atomic layer CVD (ALCVD, atomic layer epitaxy, ALE) for producing $In_2S_3$ (for the manufacture of buffer layers) is described in T. Asikainen et al. "Growth of $In_2S_3$ Thin Films by Atomic Layer Epitaxy" Appl. Surface Science 82/83 (1994) 122-125. This method uses $H_2S$ gas and $InCl_3$ which is sequentially evaporated at 275° C. and absorbed as a monolayer on a substrate surface heated to 300° C. to 400° C. Another sequential ALCVD method for solar cells is described in N. Naghavi et al "High Efficiency Copper Indium Gallium Diselenide (CIGS) Solar Cells with Indium Sulfide Buffer Layers Deposited by Atomic Layer Chemical Vapor Deposition (ALCVD)" Prog. Photovolt: Res. Appl. 2003; 11:437-443, where indium acetylacetonate $In(acac)_3$ evaporated at 125° C. and $H_2S$ gas are used at substrate temperatures of 160° C. to 260° C.

Afzaal et al.: "Metal-Organic Chemical Vapor Deposition of β-$In_2S_3$ Thin Films Using a Single-Source Approach" J. of Mat. Sc: Mat. in Electr. 14 (2003) 555-557 describes an aerosol-assisted metal-organic CVD method (AAMOCVD), which uses a single, sulfur-containing precursor to be manufactured separately for producing $In_2S_3$ on a substrate heated to 425° C. to 475° C. Both Barone et al. "Deposition of Tin Sulfide Thin Films from Tin(IV) Thiolate Precursors" J. Mater. Chem., 2001, 11, 464-468 and Parkin et al. "The First Single Source Deposition of Tin Sulfide Coatings on Glass: Aerosol-Assisted Chemical Vapor Deposition using [Sn$(SCH_2CH_2S)_2$]" J. Mater. Chem., 2001, 11, 1486-1490 describe the use of AACVD to produce tin sulfide for photovoltaic materials. In Barone et al., the following products are obtained depending on the substrate temperature: SnS (500° C.), $SnS_2$ (350° C. to 450° C.) and $Sn_2S_3$ (400° C.). In this method, complex precursors, such as tin phenyl sulfur, or simple precursors, such as tin chloride, are used together with $H_2S$ gas which, in the case of a sulfur-containing precursor, is primarily intended to prevent the formation of oxides, and in the case of a sulfur-free precursor is involved in the reaction.

In K. C. Molloy et al.: "New Precursors for the Chemical Vapour Deposition of Tin Sulphide Semiconductors and Related Materials" EPSRC Reference GR/L56442/01 and GR/L54721/01, 2001, atmospheric pressure chemical vapor deposition (APCVD) is used to produce an n-type semiconductive tin sulfide thin film (tin(III) sulfide $Sn_2S_3$) on a substrate heated to a temperature between 475° C. and 525° C. In this process, two precursors, namely a tin-containing soluble precursor ($SnCl_4$ (a liquid having a boiling point of 114° C.) or $SnBr_4$) and hydrogen sulfide ($H_2S$) as a reactive gaseous precursor are used in an inert nitrogen carrier gas stream. Reaction of $SnCl_4$ or $SnBr_4$ with $H_2S$-Gas yielded corresponding homogeneous single-phase films on large glass plates as substrates. The deposition parameters monitored during the process were substrate temperature, precursor concentration, and gas flow rate. It was found that the substrate temperature had the greatest effect on the synthesis (brown $Sn_2S_3$ was obtained at 475° C. to 525° C.), whereas variation of the flow rate of the $H_2S$ gas had no effect on the film stoichiometry. With an unlimited supply of $H_2S$, there was a proportionality between the deposition rate and the rate at which the tin precursor was supplied. A production process in which no toxic $H_2S$ gas is used; i.e., in which sulfur is supplied via the solid precursor, can only be achieved using AACVD, because the vapor pressure (boiling point) of the sulfur-containing precursors used is too low for APCVD. It should also be noted that the reaction behavior of Sn differs from that of In (different main group). Therefore, it is not readily apparent to one skilled in the art to make $In_2S_3$ using APCVD based on simple conclusions drawn by analogy.

SUMMARY

In an embodiment, the present invention provides an atmospheric pressure chemical vapor deposition method for producing an N-type semiconductive metal sulfide thin film on a heated substrate. The method includes converting an indium-containing precursor to at least one of a liquid phase and a gaseous phase. The indium-containing precursor is mixed with an inert carrier gas stream and hydrogen sulfide in a mixing zone so as to form a mixed precursor. A substrate is heated to a temperature in a range of 100° C. to 275° C. and the mixed precursor is directed onto the substrate. The hydrogen sulfide is supplied at a rate so as to obtain an absolute concentration of hydrogen sulfide in the mixing zone of 1% or less by volume. The In-concentration of the indium containing precursor is selected so as to produce a compact indium sulfide film.

BRIEF DESCRIPTION OF THE DRAWING

An exemplary embodiment of the invention is described in additional detail below with reference to the drawing, in which:

The FIGURE is a schematic diagram illustrating the sequence of a method in accordance with an embodiment of the invention.

DETAILED DESCRIPTION

In an embodiment, the present invention provides an atmospheric pressure chemical vapor deposition method (APCVD) using parameters in such way that a compact indium sulfide thin film can be produced without solid reaction products already being formed in the gas phase. These solid reaction products were a previous disadvantage known to those skilled in the art.

Using a method in accordance with the present invention, compact indium sulfide thin films ($In_2S_3$) with high homogeneity and quality, which are particularly suitable for use as buffer layers in solar cells and may therefore replace the toxic CdS buffer layers, can, for the first time, be produced directly using a straightforward CVD process type, namely atmospheric pressure CVD, in a rapid, economical and reproducible manner. In addition to the simple deposition of the indium-containing precursor involving sulfurization on the substrate surface, a reaction of $H_2S$ with the indium-containing precursor occurs already downstream of the mixing point, either in aerosol droplets or in the gas phase, as a result of which more $In_2S_3$ is deposited on the substrate surface. To this end, initially, an indium-containing precursor which either itself has a high vapor pressure or forms a volatile adduct with a solvent, is converted to a liquid phase (dissolved and converted to an aerosol) or to a gaseous phase. The indium-containing precursor present in liquid form (as an aerosol) or in gaseous form is then mixed with hydrogen sulfide gas and an inert carrier gas stream in a CVD reactor. Depending on the state of aggregation of the precursor, a gas/liquid mixing point or a gas/gas mixing point is obtained. In the case of both mixing points, high-quality indium sulfide films can be produced. In particular, the possibility of mixing the two precursors at the gas/liquid mixing point is, on the one hand, attractive because it allows the use of spray methods and, on the other hand, is surprising because one would expect formation of powder in the gas/liquid phase. In order to achieve a homogeneous film formation, it may be advantageous for all constituents to flow in a laminar fashion over the substrate.

The adjustment of the ratio of the indium used to the sulfur used, and the selection of the substrate temperature, are of decisive importance in order to prevent the formation of unwanted solid reaction components already within the reactor. In contrast to the statement made in K. C. Molloy et al., supra, according to which in the APCVD method, the gas rate has no influence on the stoichiometry and that it is therefore possible to provide an excess of $H_2S$, it has been found that when using the heavy metal indium (In) from the boron group instead of the heavy metal tin (Sn) from the carbon group, very surprisingly, the quantity of available sulfur is one of the two main parameters for obtaining a high-quality indium sulfide thin film. In accordance with an embodiment of the present invention, therefore, the supply of the hydrogen sulfide gas is controlled such that a sulfur concentration of equal to or less than 1% by volume is obtained in the carrier gas stream. Thus, in accordance with this embodiment of the present invention, and in contrast to the excess of sulfur described in K. C. Molloy et al., supra, the quantity of available sulfur is extremely limited.

Besides the $H_2S$ concentration or sulfur concentration or the ratio of indium to $H_2S$, the substrate temperature is also an important process parameter for the formation of homogeneous films. However, in K. C. Molloy et al., supra, tin(III) sulfide ($Sn_2S_3$) does not form until temperatures of 475° C. to 525° C. are reached. In contrast, in accordance with an embodiment of the present invention, it was very surprisingly found that satisfactory film results could be obtained when setting the temperature to a value equal to 100° C. or between 100° C. and 275° C. This is of particular importance because solar cell absorbers, once manufactured, can only withstand temperatures of up to about 275° C. without being damaged. It was also found that, in accordance with an embodiment of the present invention, indium sulfide thin films can be produced already at a temperature as low as 100° C. without impairing the substrate, a very moderate temperature which makes it possible to use virtually all types of substrates, including, in particular, those made from plastic materials, glass materials, or absorber material as the substrate.

In accordance with an embodiment of the present invention, as already described above, the indium-containing precursor may be mixed in the liquid state (liquid droplets in air=aerosol) with the gaseous precursor without the formation of powder. For this purpose, the indium-containing precursor may be converted to a liquid phase by dissolving it in a solvent and atomizing the solution using an ultrasonic generator or a pneumatic atomizer so as to produce an aerosol of extremely fine droplets. Alternatively, the indium-containing precursor may also be converted to a gaseous phase. This may be accomplished by passing a solvent vapor over the indium-containing solid precursor. For example, ethanol vapors are produced by bubbling inert gas, such as $N_2$, through ethanol, and are then passed over solid $InCl_3$. As another alternative, the conversion to the gaseous phase may also be accomplished by dissolution in a solvent and dripping of the solution onto a heated surface. The inert gas then flows over the heated surface and, as before, conveys the volatile precursor to its combination with $H_2S$ and onto the substrate. In both cases, a volatile $InCl_3$-ethanol adduct is obtained, which decomposes on the substrate to form $InCl_3$ or In(Cl, O, OH), depending on the temperature, and deposits on the substrate, where it undergoes further reaction to form $In_2S_3$. Concurrently, a reaction with $H_2S$ forming sulfur-containing intermediates may take place in the gas phase or aerosol, and in such a way that no solid particles are formed. These intermediates may further react on the surface to form $In_2S_3$. What occurs on the hot substrate surface in any case is the deposition of $In_2S_3$.

Further, the indium-containing precursor may preferably be a halide salt of indium. Examples of halides include F, Cl, Br and iodine. The halide salt may be indium chloride ($InCl_3$). Alternatively, the indium-containing precursor may also be a β-diketonate, such as indium acetylacetonate ($In(acac)_3$) or a derivate thereof. Furthermore, generally speaking, the solvent may be an alkanol, such as ethanol or another alcohol, or a ketone, such as acetone. Finally, the carrier stream used is preferably a nitrogen carrier stream ($N_2$).

An advantage provided by APCVD is that the process takes place at atmospheric pressure (ambient pressure). Therefore, there is no need for sealed vessels or vacuum pumps, which allows for easy implementation of continuous flow systems. Analogously to the ambient pressure, the temperature prevailing in the reaction space may be ambient temperature (room temperature). The supply of the reaction energy needed to form $In_2S_3$ is accomplished by heating of substrate and, optionally, by preheating of the precursors used and of the carrier gas stream. Depending on which of the above-mentioned materials are used (g=gaseous, li=liquid, s=solid), the overall reactions are as follows:

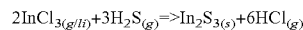

or

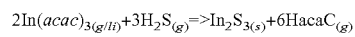

In the process, the following intermediate steps may occur, and corresponding intermediates may be formed (non-stoichiometric ally):
1. $InCl_{3(g/li)} + EtOH \rightarrow In_xX_y$
2. $In_xX_y + H_2S \rightarrow In_xZ_z$ (Z contains S)
3. $In_xZ_z + heat \rightarrow In_2S_{3(s)}$ Moderate preheating of the mixture of hydrogen sulfide ($H_2S$) and the carrier gas stream accelerates the reaction, and thus the deposition or growth rate. Premature powder formation in the reaction space is prevented by controlling the temperature to room temperature or moderately heating the precursors outside of the effective range of the heated substrate.

The FIGURE shows a CVD reactor APCVD-R working at atmospheric pressure. The materials used are a first precursor $PR_{H2S(g)}$ in the form of hydrogen sulfide gas $H_2S$ and a second precursor $PR_{In(g/li)}$, which contains indium (In) and may be gaseous or liquid (in solution). Moreover, an inert gas stream IG is supplied at a feed point which may be located not only at the position shown, but also at any other suitable position. In the process, the supply of the gaseous precursor $PR_{H2S(g)}$ is controlled, for example by a control valve DV, in such a way that an absolute concentration of less than 1% by volume is obtained downstream of the mixing point, the concentration of the indium-containing precursor being adjusted such that a particularly compact indium sulfide film will be produced. The ratio of $H_2S$ to $PR_{In(g/li)}$ is also decisive for the quality of the film. Second precursor $PR_{In(g/li)}$ is supplied at an optimum rate (e.g., 25 μM/min). If second precursor $PR_{In(g/li)}$ is atomized, its concentration may be determined by optical reflectance measurement. If the absolute hydrogen sulfide concentration deviates from the predefined setpoint value (≤1% by volume in mixing zone MP), said concentration may be corrected accordingly.

The deposition rate is determined by the concentration of gaseous precursor $PR_{H2S(g)}$ and by the temperature of mixed precursor MPR forming in mixing zone MP from first precursor $PR_{H2S(g)}$ and second precursor $PR_{In(g/li)}$. In mixing zone MP, a mixed precursor MPR is formed. Due to the selected parameters (pressure is ambient pressure RPR; i.e., atmospheric pressure (the mean atmospheric pressure at sea level is 1013.25 mbar with a variation from 869.9 mbar to 1085.7 mbar) and the temperature is ambient temperature RTE (room temperature, for example 18° C. to 22° C.), a reaction occurs in which sulfur-containing intermediates are formed, but no reaction which would result in the premature formation of $In_2S_3$, and thus in the formation of powder. Rather, mixed precursor MPR is transported to a substrate SU whose surface was heated to a temperature T between 100° C. and 275° C. Thus, a reaction zone RP is created on or immediately above substrate SU, in which reaction zone the intermediates undergo decomposition and as the case may be the two precursors $PR_{H2S(g)}$ and $PR_{In(g/li)}$ react with each other, forming the desired homogeneous metal sulfide thin film on substrate SU. Undeposited reaction products UPR are collected downstream of substrate SU and may be recycled.

Example of the Manufacture of a Homogeneous Compact Indium Sulfide Thin Film

Indium chloride $InCl_3$ is a solid having a low vapor pressure; i.e., a very high melting point and boiling point (586° C.). In order to make this material processable by APCVD, it is converted into an adduct of higher volatility by, for example, using an alcohol. Therefore, $InCl_3$ is initially dissolved (to a concentration of 25 mM) in ethanol (alternatively in acetone, alternatively $In(acac)_3$ in ethanol). Then, this solution is atomized at a rate of 1 ml/min. The resulting aerosol is transported by a nitrogen carrier gas stream at a flow rate of 5 l/min and mixed with a gas stream of 5% by volume of $H_2S$ in Ar, which is injected at a rate of 15 ml/min.

An absolute $H_2S$ concentration of 0.015% by volume is obtained, which is significantly below 1% by volume. Mixed precursor MP, which includes carrier gas IG, aerosol (indium-containing precursor $PR_{In(g/li)}$ and reactive gas (gaseous precursor $PR_{H2S(g)}$) (and possibly sulfur-containing intermediates), is then directed (possibly in a laminar flow) onto heated substrate SU, which is at a temperature T=200° C. Then, a compact film of indium sulfide $In_2S_3$ forms on heated substrate SU at a growth rate of 9 nm/min. Film formation can already be achieved when substrate SU is at a temperature T=100° C. In this case, however, the growth rate is only 2 nm/min. During manufacture, the ambient temperature is room temperature. Preheating of the gases/gas mixture below the deposition temperature (permissible substrate temperature) results in an increase in the growth rate. Finally, it should be noted that the indium sulfide film also contains chlorine ($In_2(S_xCl_{2y})_3$ where x+y=1). However, this chlorine content does not negatively affect the quality of the manufactured film, even when the film is used as a buffer layer in a solar cell.

LIST OF REFERENCE CHARACTERS

APCVD-R CVD reactor at atmospheric pressure
DV control valve
$PR_{H2S(g)}$ first precursor (hydrogen sulfide gas $H_2S$)
$PR_{In(g/fl)}$ $PR_{In(g/li)}$, second precursor (contains indium)
g gaseous
fl li, liquid
f s, solid
IG inter gas stream
MPR mixed precursor
MP mixing zone
RPR ambient pressure
RTE ambient temperature
SU substrate
T temperature
RP reaction zone
UPR undeposited reaction products

What is claimed is:

1. An atmospheric pressure chemical vapor deposition method for producing an N-type semiconductive metal sulfide thin film on a heated substrate, the method comprising:
   converting an indium-containing precursor to at least one of a liquid phase and a gaseous phase;
   mixing the indium-containing precursor with an inert carrier gas stream and hydrogen sulfide in a mixing zone so as to form a mixed precursor;
   heating a substrate to a temperature in a range of 100° C. to 275° C.; and
   directing the mixed precursor onto the substrate;
   supplying the hydrogen sulfide at a rate so as to obtain an absolute concentration of hydrogen sulfide in the mixing zone of 1% or less by volume; and
   selecting the In-concentration of the indium containing precursor so as to produce a compact indium sulfide film.

2. The atmospheric pressure chemical vapor deposition method recited in claim 1, wherein the indium-containing precursor has a vapor pressure that facilitates the converting of the indium-containing precursor to the at least one of a liquid and a gaseous phase.

3. The atmospheric pressure chemical vapor deposition method recited in claim 1, wherein the indium-containing precursor forms a volatile adduct with a solvent so as to facilitate the converting of the indium-containing precursor to the at least one of a liquid phase and a gaseous phase.

4. The atmospheric pressure chemical vapor deposition method recited in claim 1 wherein a flow of the mixed precursor over the substrate is laminar.

5. The atmospheric pressure chemical vapor deposition method recited in claim 1, wherein the indium-containing precursor is dissolved in a solvent, and wherein the converting of the indium-containing precursor includes atomizing the solution using at least of an ultrasonic generator and a pneumatic atomizer so as to produce an aerosol of extremely fine droplets.

6. The atmospheric pressure chemical vapor deposition method recited in claim 1, wherein the indium-containing precursor is a solid, and wherein the converting of the indium containing precursor includes passing a solvent vapor over the indium-containing solid precursor so as to convert the indium-containing solid precursor to the gaseous phase.

7. The atmospheric pressure chemical vapor deposition method recited in claim 1, wherein the indium-containing precursor is dissolved in a solvent so as to form a solution, and wherein the converting of the indium-containing precursor includes dripping the solution onto a heated surface so as to convert the indium-containing precursor to the gaseous phase.

8. The atmospheric pressure chemical vapor deposition method recited in claim 1, wherein the indium-containing precursor includes at least one of a halide salt of indium and a solvent adduct of the halide salt.

9. The atmospheric pressure chemical vapor deposition method recited in claim 8, wherein the halide salt is InCl3.

10. The atmospheric pressure chemical vapor deposition method recited in claim 1, wherein the indium-containing precursor is a β-diketonate.

11. The atmospheric pressure chemical vapor deposition method recited in claim 10, wherein the β-diketonate is indium acetylacetonate.

12. The atmospheric pressure chemical vapor deposition method recited in claim 3, wherein the solvent includes at least one of an alcohol and a ketone.

13. The atmospheric pressure chemical vapor deposition method recited in claim 12, wherein the solvent includes at least one of an ethanol and an acetone.

14. The atmospheric pressure chemical vapor deposition method recited in claim 1, wherein the carrier gas stream (IG) includes $N_2$.

15. The atmospheric pressure chemical vapor deposition method recited in claim 1, wherein a vicinity surrounding the heated substrate is at room temperature.

16. The atmospheric pressure chemical vapor deposition method recited in claim 1, further comprising preheating at least one of the hydrogen sulfide and the mixed precursor.

\* \* \* \* \*